United States Patent [19]

Yamamoto et al.

[11] Patent Number: 4,806,982
[45] Date of Patent: Feb. 21, 1989

[54] IMAGING DEVICE

[75] Inventors: Takemi Yamamoto, Nagoya; Kenji Sakakibara, Ichinomiya; Masashi Ueda, Nagoya, all of Japan

[73] Assignee: Brother Kogyo Kabushiki Kaisha, Tokyo, Japan

[21] Appl. No.: 131,893

[22] Filed: Dec. 11, 1987

[30] Foreign Application Priority Data

Dec. 15, 1986 [JP] Japan .......................... 61-192779[U]
Dec. 15, 1986 [JP] Japan .......................... 61-192780[U]
Dec. 26, 1986 [JP] Japan .......................... 61-199622[U]

[51] Int. Cl.$^4$ ........................ G03B 27/32; G03B 27/52
[52] U.S. Cl. ......................................... 355/27; 355/45
[58] Field of Search .................... 355/72, 44, 45, 50, 355/77, 27

[56] References Cited

U.S. PATENT DOCUMENTS 3,730,622 5/1973 Freeman et al. ............... 355/45 X
3,765,759 10/1923 Yamada ............................... 355/45

Primary Examiner—Richard A. Wintercorn
Attorney, Agent, or Firm—Kane, Dalsimer, Sullivan, Kurucz, Levy, Eisele and Richard

[57] ABSTRACT

In response to light reflected by a manuscript, a latent photo-image corresponding to the manuscript is formed on a photosensitive member comprising photocurable microcapsules containing therein dye precursor reactable to a color developing agent to develop a visible image. The photosensitive member is conveyed from a supply source, via a light exposure platform, to a developing section in an imaging device, while effectively protected from ambient light. When a transfer member is used to pass through the developing section, together with the photosensitive member, a separator lug is provided for separating the transfer member from the photosensitive member immediately after passing through the developing section. The exposure platform has a surface of an excellent light-absorptive material to prevent the recording sheet from being exposed again to light reflected from the platform surface.

16 Claims, 4 Drawing Sheets

IMAGING DEVICE

BACKGROUND OF THE INVENTION

This invention relates to an imaging device, such as a copying apparatus, utilizing a photosensitive recording sheet.

Prior art imaging device includes a type utilizing a photo sensitive recording sheet which comprises a paper sheet and microcapsules supported on said paper sheet and enveloping therein a dye precursor and a photo-curable resin. One example of said photosensitive recording sheets has been disclosed in the U.S. Pat. No. 4,399,209 or 4,440,846. The microcapsules are cured to become a rigid body when the surface of the recording sheet of this type is exposed to light, whereas the microcapsules not subjected to light exposure are not cured and therefore easily collapsible by applying pressure thereto.

Utilizing such characteristics, it has recently been proposed to form a latent image on the recording sheet by exposing the sheet surface in response to given image information, then destroy the uncured microcapsules by applying pressure to the sheet surface to allow the inside dye precursor to flow out, whereby the dye precursor reacts with a color developing agent precoated on the recording sheet itself or another transfer sheet to thereby form thereon a visible image, as disclosed in the U.S. Ser. No. 33,331. With this imaging device, it is possible to provide a desired duplicated image with high resolution and clearness and the maintenance thereof becomes easier because no toner powder is used.

In this prior art imaging device the recording sheet is prepared as a continuous paper wound into a roll and a takeup roller is employed for winding up a free end of the rolled paper, to thereby meet the requirement that the recording sheet supporting thereon collapsible microcapsules be travelled through the device between the light exposure section and the developing section, while applying no pressure to the sheet surface.

The rolled paper system adopted in this prior art imaging device is, as above described, preferred from a standpoint of contact-free conveyance of the recording sheet inside the apparatus. However, this system makes it difficult to separate the recording sheet from the transfer sheet after they come into contact under pressure at the developing station, that is, the transfer sheet would tend to be wound by the roller together with the recording sheet.

Another disadvantage encountered with actual use of such a prior art imaging device is that the recording sheet may often be exposed to ambient light during its travel from a supply source to the developing station, which makes it impossible to duplicate a photo-image exactly corresponding to the given image information. This becomes a fatal shortcoming especially when the rolled paper system is adopted, because the rolled paper is stored in the device for a long period of time so that the microcapsules contained in the rolled paper would tend to be hardened with time.

In the light exposure process, the light is projected onto the surface of the recording sheet mounted on an exposure platform, a portion of which is transmitted through the recording sheet and then reflected from the exposure platform, resulting in that the recording sheet is again exposed to the reflected light. Thus, the image profile once formed by the original projecting light would be blurred or deformed by the reflection to reduce resolution.

SUMMARY OF THE INVENTION

It is therefore an object of this invention to eliminate the above disadvantages of the prior art imaging device utilizing a photosensitive recording sheet.

Another object of this invention is to provide a novel imaging device capable of constantly reproducing a clear photo image.

Another object of this invention is to prevent a photosensitive recording sheet from being exposed to ambient light while travelling through the imaging device of the aforementioned type.

Still another object of this invention is to provide separator means for smoothly separating the recording sheet and the transfer sheet after passing through pressure applying means mounted within the imaging device of the aforementioned type for collapsing the uncured microcapsules contained in the surface of the recording sheet to allow the inside dye precursor to flow out onto the transfer sheet, thus the transfer sheet on which the given photo-image is formed may be travelled away from the recording sheet.

Further object of this invention is to provide a light exposure platform of the imaging device of the aforementioned type, capable of reducing probability that light projected from a manuscript and penetrating the recording sheet be again exposed to the reflection.

According to an aspect of this invention, there is provided an imaging device wherein a latent image is formed by projecting a photo-image on a photosensitive member before developing a visible image, which comprising a housing support adapted to support a manuscript thereon; light exposure means provided in said housing for duplicating a photo-image of said manuscript placed on said support on said photosensitive member; conveying means for conveying said photosensitive member through said housing; and light shielding means for protecting said photosensitive member against ambient light other than the light impinged thereon by said light exposure means, while travelling through said housing.

According to another aspect of this invention, there is provided an imaging device wherein a continuous sheet carrying thereon photosensitive microcapsules each enveloping a dye precursor therein is utilized to form a latent image thereon, and a recording medium carrying thereon a color developing agent which reacts to said dye precursor to develop color is utilized to develop a visible image thereon, which comprises; a housing having a manuscript table; first conveying means for conveying said continuous sheet through said housing, said first conveying means including a first roller about which said continuous sheet is rolled and a second roller adapted to wind up said continuous sheet supplied from said first roller; a light source for emitting light sensible by said photosensitive microcapsules toward a manuscript placed on said manuscript table; light exposure means provided in said housing between said first and second rollers for exposing said light to said continuous sheet to duplicate a photo-image of said manuscript on said continuous sheet; contact means for bringing said recording medium into contact under pressure with said continuous sheet having been subjected to the light exposure, to thereby destroy said microcapsules of a portion not exposed to said light, whereby said dye precursor flowing out of said destroyed microcapsules reacts to said color developing agent on said recording medium to transfer said duplicated photo-image on said continuous sheet to said recording medium; and second conveying means for conveying said recording medium on which said duplicated photo-image has been developed, away from said continuous sheet, to the outside of said housing.

According to still another aspect of this invention, there is provided a light exposure device used in an imaging device comprising; a platform adapted to support thereon a photosensitive member; a light source for emitting light to a manuscript; means for impinging the reflections from said manuscript onto said photosensitive member placed on said platform; and means for absorbing the reflections transmitted through said photosensitive member.

DESCRIPTION OF THE ACCOMPANYING DRAWINGS

DESCRIPTION OF THE PREFERRED EMBODIMENTS

Figure 1:
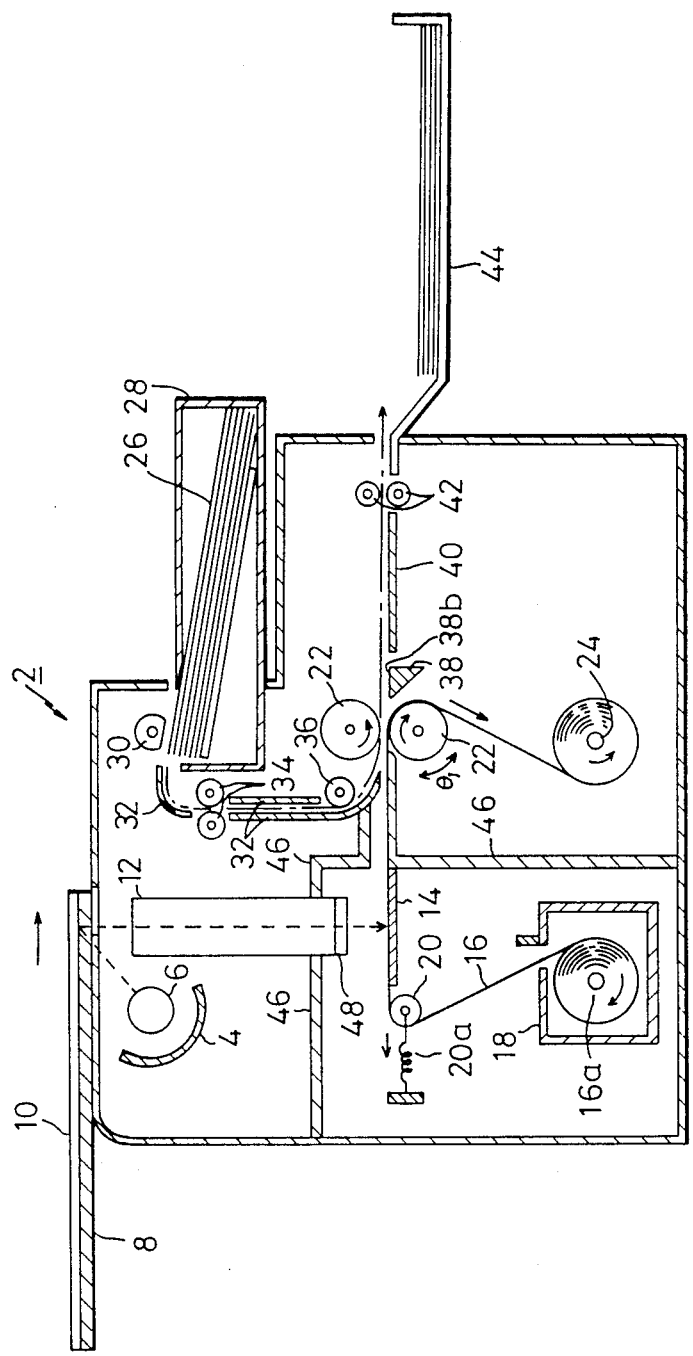
FIG. 1 is a diagrammatic side view showing a copying apparatus embodying the invention.

FIG. 1 shows a copying apparatus 2 embodying the invention wherein light is radiated from a source 6 onto a manuscript 10 placed on a transparent manuscript support or table 8. The light radiation angles are restricted by a reflector plate 4 positioned behind the source 6. The reflections from the manuscript are focused onto the surface of a photosensitive paper on an exposure platform 14, via celfoc rod arrey 12, as indicated by a dotted line arrow in FIG. 1. The photosensitive paper carries on its surface photocurable microcapsules containing therein a dye precursor, so that the microcapsules are cured and hardened in response to the reflections from the manuscript 10 to produce a latent image corresponding to the photo-image of the manuscript 10. The manuscript support 8 is movable to the right as viewed in FIG. 1 in syschronism with the photosensitive paper 16 travelling through the platform 14.

In this apparatus, the photosensitive paper 16 is formed into a continuous rolled paper. The continuous photosensitive paper 16 wound around a cylindrical core 16a is contained in a portable protective case 18 detachably fitted in the device 2. Ambient light is effectively prevented from entering the protective case 18 so as not to photo-cure the microcapsules on the roller paper 16 when handling the case 18 outside the device 2.

Provided that a paper supply unit comprising the paper roll 16 and the protective case 18 is installed at a predetermined supply station in the device 2, the paper roll may be wound off from the unit and travel along a path determined by a guide roller 20, exposure platform 14, a pair of pressure rollers 22 and a takeup roller 24 in the direction shown by the arrow of a solid line, by means of a motor, not shown, mounted to rotate the take-up roller 24 in the counter-clockwise direction. The paper core 16a is caused to rotate in the clockwise direction to prevent excessive supply of paper roll 16 from the case 18. A spring 20a biases the guide roller 20 to the left, thereby applying a desired degree of tension to the paper 16 traveling on the platform 14.

A storage cassette 28 is detachably mounted on the device 2 and contains a set of transfer sheets 26 coated on its surface with a color developing agent which develops color in reaction to the dye precursor contained in microcapsules. The transfer sheet 26 are pulled out of cassette 28 piece by piece by means of a feed roller 30, and are delivered along guide walls 32 and guide rollers 34 and 36 to join into the travel path of paper roll 16 at the right end of platform 14. Thus, the paper roll 16 and the transfer sheet 26 are together introduced to the pressure rollers 22. At this time, the sensitive paper 16 has been exposed to the reflections from the manuscript 10 so that microcapsules on the surface of the paper 16 have been photo-cured and hardened responsive to the photo-image of the manuscript 10, whereas the remaining uncured or unhardened microcapsules will be destroyed while the paper 16 passed between the pressure rollers 22. The dye precursor flows out of the destroyed microcapsules to move onto the surface of the transfer sheet 26 which also passes between the pressure rollers 22 in contact under pressure with the paper 16, to react with the color developing agent on the transfer sheet 26. Consequently, the photo-image of the manuscript 10 is clearly reproduced on the transfer sheet 26.

Figure 2:
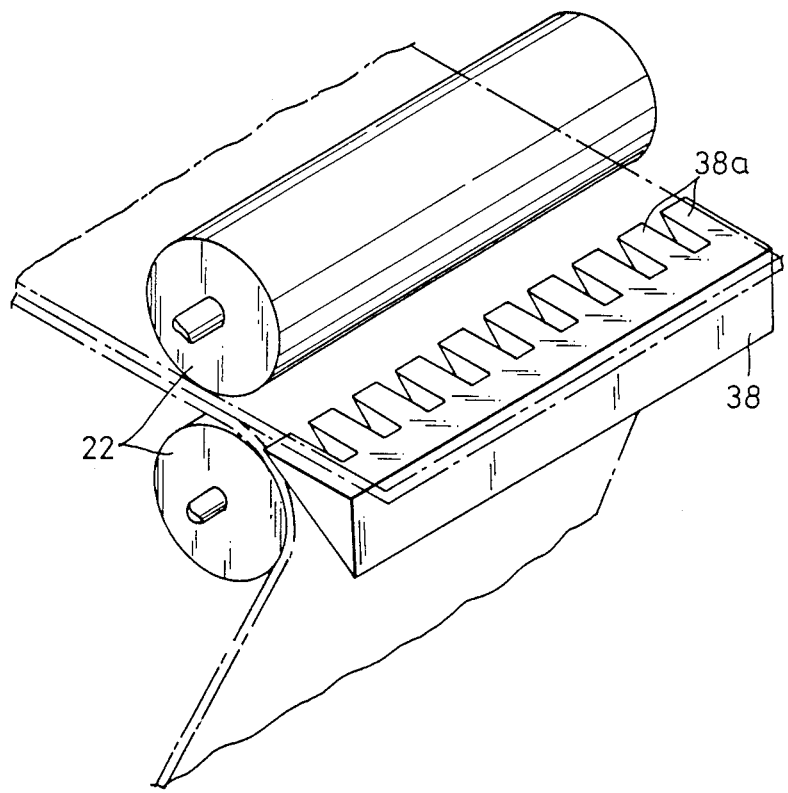
FIG. 2 is a diagrammatic oblique view, on an enlarged scale, showing a portion of the copying apparatus of FIG. 1.

After passing through the pressure rollers 22, the transfer sheet 26 on which the photo-image of the manuscript 10 has been formed is moved to the right via a guide surface 40 and a pair of guide rollers 42 and discharged to a collection tray 44 disposed outside the device 2, while the paper roll 16a is wound up by the take-up roller 24 mounted beneath the pressure rollers 22. To effectively separate the transfer sheet 26 from the rolled paper 16, there is provided a separator or stripping lug 38 between the pressure rollers 22 and the guide surface 40. As illustrated in FIG. 2, the lug 38 has generally a triangular section and is provided with a plurality of pointed ends 38a directed toward the pressure rollers 22. The distance between the pointed ends 38a and the lower pressure roller 22 is preferably 1.2 to 2 times of the thickness of the paper 16. The lug 38 is preferably made of metal which would not deteriorate due to the dye precursor discharged from the microcapsules of photosensitive paper 16.

With the above-described copying apparatus 2, it is especially important to prevent the ambient light from impinging upon the surface of photosensitive paper 16 traveling through the apparatus. If the photosensitive paper should be subjected to light exposure other than the reflections from the manuscript 10, the photo-image inherent in the manuscript 10 be erroneously produced on the paper. To scope with this problem, the device 2 according to this embodiment is provided with a light shield screen 46 which protect the travel path of photosensitive paper 16 between the protective case 18 and the pressure rollers 22 from ambient light. Moreover, one end of the celfoc rod arrey 12 facing the exposure platform 14 is provided with a shutter 48 which will be automatically operated to impinge on the sensitive paper 16 only the reflections from the manuscript 10.

Figure 3:
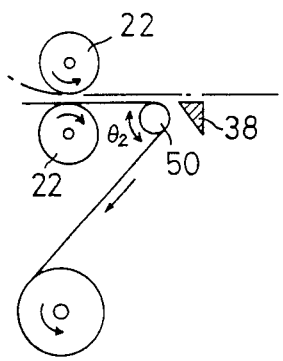
FIG. 3 is a diagrammatic partial side view showing another embodiment of this invention.

With the copying apparatus illustrated in FIGS. 1 and 2, the separator lug 38 is provided to separate the transfer sheet 26 from the rolled paper 16 after the photo-image has been transferred onto the transfer sheet by means of the pressure applying rollers 22. Transfer sheet 26 is moved toward the outlet substantially in the horizontal direction, while the travel path of sensitive paper 16 is turned around the lower pressure roller 22 at an angle $\theta 1$. Another measure to efficiently separate the transfer sheet 26 from the photosensitive paper 16 is to guide the paper 16 much far away from the horizontal travel path of the transfer sheet 26, which can be achieved by making more acute the angle $\theta 1$. For example, the diameter of the lower pressure roller 22 and/or the take-up reel 24 may be made much larger. Alternatively, as illustrated in FIG. 3, an additional guide roller 50 may be interposed between the pressure rollers 22 and the separator 38 to create a more acute angle $\theta 2$ in the travel path of the rolled paper 16, which directs much far from the transfer sheet 26.

While the embodiments described above refer to the copying apparatus of a reflection type in which the sensitive paper 16 is exposed to the reflections of the lights from the source 6 upon the manuscript 10, it should be noted that the above technical idea can also be applicable to a transparent type in which the sensitive paper is exposed to light passing through a transparency such as microfilm and also to a laser printer in which a laser beam is radiated onto the photo-sensitive paper to produce the photo-image on the transfer sheet. Further, apart from the transfer type described, the self-developing type may be employed in which no transfer sheet is employed and the color developing agent which reacts to the dye precursor contained in microcapsules may be coated on the photosensitive paper itself, and the photo-image of the manuscript is duplicated thereon.

Figure 4:
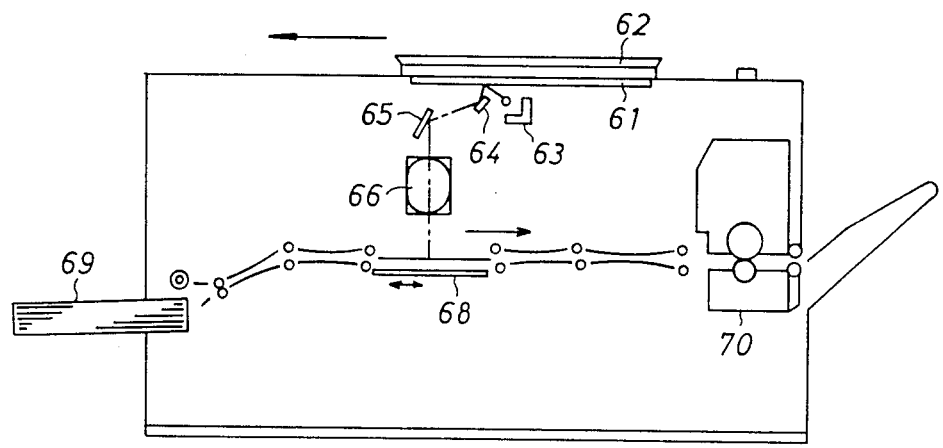
FIG. 4 is a diagrammatic side view showing a copying apparatus according to another aspect of this invention.

In the copying apparatus of a self-developing type as illustrated in FIG. 4, a manuscript 62 is placed on a horizontal table 61 of a transparent glass. A scanning light is emitted from a source 63 toward the manuscript 62 and the reflections are focused on a photosensitive paper 67 on a platform 68 through reflection mirrors 4 and 5 and an imaging lens 6, to reduce on the paper 67 a latent image corresponding to the photo-image of the manuscript 62. The exposure platform 68 used is of a reverse type and the manuscript table 62 is moved in synchronism with the platform 68. The photosensitive paper 67 comprises microcapsules containing dye precursor and coated thereon a color developing agent which react to the dye precursor to develop color, which is supplied from a cassette 69 piece by piece to the platform 68 and transferred in its feeding direction by means of any suitable conveyance means, not shown. The latent image formed on the photosensible paper 67 is transformed to a clear photo-image by a developing unit 70 in a known manner.

Figure 5:
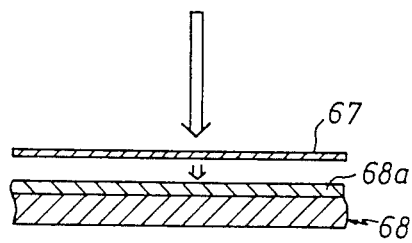
FIG. 5 is an explanatory view showing an exposure platform of the copying apparatus shown in FIG. 4.

Referring specifically to FIG. 5, the exposure platform 68 comprises a surface of a light-absorptive material 68a, which may be a black paint or a black resin plate such as an ebonite rubber plate bonded onto the base. The reflections impinged on the photosensitive paper 67 is transmitted therethrough to shine on the black surface 68i a of the platform 68, which will absorb almost 100% of the light with no shining back to the sensitive paper 67. This means that the sheet 67 is exposed only to the downward reflections from the manuscript with no exposure to the upward reflections from the platform surface. This prevents defocusing or distortion of the contour of the photo-image formed on the sheet surface corresponding to that of the manuscript 62.

Figure 7:
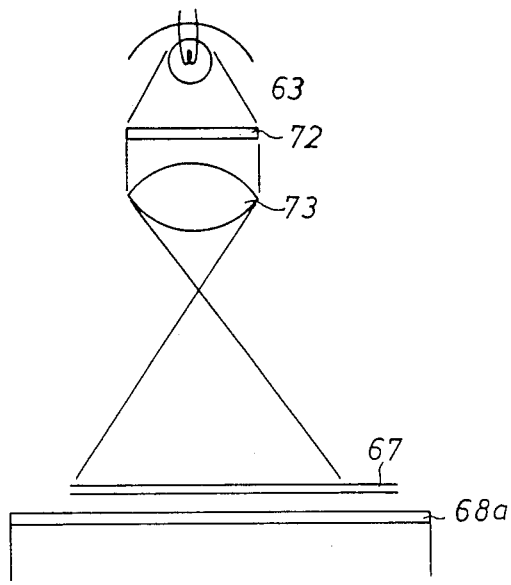
FIGS. 6 and 7 are explanatory views showing the exposure platform according to this invention adopted in exposure system of different types than in FIG. 5.
Figure 6:
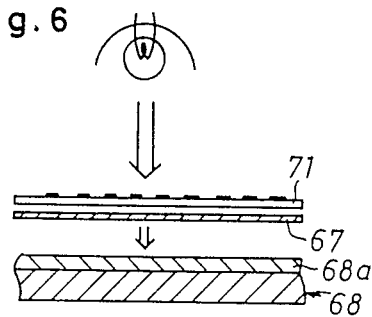

The exposure system adapted is of a reflection type in which the reflections from the manuscript 62 are impinged on the photosensitive paper 67. FIG. 6 shows another type in which the light from the source 63 is impinged on a transparent intermediate film 71 (negative or positive film) superposed on the photosensitive paper 67 on the platform 68, and FIG. 7 shows still another type in which the light from the source 63 is passed through an intermediate film 72 and a latent image formed on the intermediate film 72 is transferred to the sensitive paper 67 via an imaging lens 73. In both modifications illustrated in FIGS. 6 and 7, the platform 68 has a surface having excellent light-absorptive characteristics or black surface 68a which will substantially absorb the light impinged on the photosensitive paper on the platform.

What is claimed is:

1. An imaging device wherein a latent image is formed by projecting a photo-image on a photosensitive member before developing a visible image wherein said photosensitive member is coated with a plurality of microcapsules enveloping therein a dye precursor and a photo-curable resin, said device comprising a housing having a support adapted to support a manuscript thereon;

light exposure means provided in said housing for duplicating a photo-image of said manuscript placed on said support on said photosensitive member;

conveying means for conveying said photosensitive member through said housing;

light shielding means for protecting said photosensitive member against ambient light other than the light impinged thereon by said light exposure means, while travelling through said housing, and pressure applying means provided in said housing for applying pressure to said photosensitive member after exposed to light by said light exposure means.

2. The imaging device according to claim 1 wherein said photosensitive member is further coated with a color developing agent which reacts to said dye precursor to develop color, and wherein said visible image is developed by said dye precursor being flown out from unhardened microcapsules which are destroyed by said pressure applying means and reacting to said color developing agent.

3. The imaging device according to claim 1 wherein said visible image is developed on a transfer member by pressurizing said photosensitive member in superposed state with said transfer member, said transfer member being coated with color developing agents which react to said dye precursor to develop said visible image.

4. The imaging device according to claim 3 which further comprises feeding means for feeding said transfer member one by one to be pressurized in superposed state with said photosensitive member by said pressure applying means.

5. An imaging device wherein a latent image is formed by projecting a photo-image on a continuous sheet photosensitive member adapted to be wound into a roll before developing a visible image comprising a housing having a support adapted to support a manuscript thereon;

light exposure means provided in said housing for duplicating a photo-image of said manuscript placed on said support on said photosensitive member;

conveying means for conveying said photosensitive member through said housing, said conveying means comprises a first roller mounted at one side of said housing about which said continuous sheet is rolled and a second roller provided at the opposite side of said housing to wind up said continuous sheet supplied from said first roller, and light shielding means for protecting said photosensitive member against ambient light other than the light impinged thereon by said light exposure means, while travelling through said housing.

6. An imaging device wherein a latent image is formed by projecting a photo-image on a photosensitive member before developing a visible image comprising a housing having a support adapted to support a manuscript thereon;

a cartridge detachably mounted within said housing for supplying said photosensitive member;

light exposure means provided in said housing for duplicating a photo-image of said manuscript placed on said support on said photosensitive member;

conveying means for conveying said photosensitive member through said housing; and light shielding means for protecting said photosensitive member against ambient light other than the light impinged thereon by said light exposure means, while travelling through said housing.

7. The imaging device according to claim 3 which further comprises separating means for leaving said transfer member from said photosensitive member after pressurized by said pressure applying means.

8. An imaging device wherein a continuous sheet carrying thereon photosensitive microcapsules each enveloping a dye precursor therein is utilized to form a latent image thereon, and a recording medium carrying thereon a color developing agent which reacts to said dye precursor to develop color is utilized to develop a visible image thereon, which comprises;

a housing having a manuscript table;

first conveying means for conveying said continuous sheet through said housing, said first conveying means including a first roller about which said continuous sheet is rolled and a second roller adapted to wind up said continuous sheet supplied from said first roller;

a light source for emitting light sensible by said photosensitive microcapsules toward a manuscript placed on said manuscript table;

light exposure means provided in said housing between said first and second rollers for exposing said light to said continuous sheet to duplicate a photoimage of said manuscript on said continuous sheet;

contact means for bringing said recording medium into contact under pressure with said continuous sheet having been subjected to the light exposure, to thereby destroy said microcapsules of a portion not exposed to said light, whereby said dye precursor flowing out of said destroyed microcapsules reacts to said color developing agent on said recording medium to transfer said duplicated photo-image on said continuous sheet to said recording medium; and second conveying means for conveying said recording medium on which said duplicated photo-image has been developed, away from said continuous sheet, to the outside of said housing.

9. The imaging device according to claim 8 wherein said contact means comprises a pair of rollers rotated in the opposite directions each other, between which said continuous sheet and said recording medium are adapted to pass together.

10. The imaging device according to claim 9 wherein said second conveying means comprises a separator hook mounted forward of said pair of rollers, having a pointed end directed to said pair of rollers and a guide surface for guiding said recording medium to the outside of said housing.

11. The imaging device according to claim 10 wherein said separator hook has a substantially triangular section.

12. The imaging device according to claim 10 wherein the distance between said pointed ends and the lower one of said pair of rollers is 1.2 to 2 times of the thickness of said continuous sheet.

13. The imaging device according to claim 10 wherein said first conveying means further comprises a guide roller disposed between said pair of rollers and said second roller in the direction toward said separator hook.

14. A light exposure device used in an imaging device comprising;

a platform adapted to support thereon a photosensitive member;

a light source for emitting light to a manuscript;

means for impinging the reflections from said manuscript onto said photosensitive member placed on said platform; and means for absorbing the reflections transmitted through said photosensitive member.

15. The light exposure device according to claim 14 wherein said absorbing means comprises a black colored surface of said platform.

16. The light exposure device according to claim 14 wherein said absorbing means comprises an ebonite rubber plate formed on said platform.

* * * * *